United States Patent
Wang et al.

(10) Patent No.: US 7,355,241 B2
(45) Date of Patent: Apr. 8, 2008

(54) NON-VOLATILE MEMORY

(75) Inventors: Pin-Yao Wang, Hsinchu (TW);
Liang-Chuan Lai, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/307,874

(22) Filed: Feb. 26, 2006

(65) Prior Publication Data

US 2007/0132001 A1    Jun. 14, 2007

(30) Foreign Application Priority Data

Dec. 13, 2005  (TW) .............................. 94144013 A

(51) Int. Cl.
*H01L 29/788*  (2006.01)

(52) U.S. Cl. .................... 257/315; 257/316; 257/E29.3

(58) Field of Classification Search ........ 257/314–316, 257/319, E29.3, E29.304
See application file for complete search history.

(56) References Cited

U.S. PATENT DOCUMENTS

| | | | | |
|---|---|---|---|---|
| 5,268,585 A | * | 12/1993 | Yamauchi | 257/316 |
| 5,427,968 A | * | 6/1995 | Hong | 438/264 |
| 5,476,801 A | * | 12/1995 | Keshtbod | 438/264 |
| 5,753,953 A | * | 5/1998 | Fukumoto | 257/316 |
| 6,764,905 B2 | * | 7/2004 | Jeng et al. | 438/267 |
| 6,930,348 B2 | * | 8/2005 | Wang | 257/315 |
| 2007/0085132 A1 | * | 4/2007 | Sanada et al. | 257/315 |

* cited by examiner

*Primary Examiner*—T. N. Quach
(74) *Attorney, Agent, or Firm*—Jianq Chyun IP Office

(57) ABSTRACT

A non-volatile memory including a substrate, a select gate, two floating gates, a control gate, and a doped region is described. The select gate is disposed on the substrate. The two floating gates are disposed on both sides of the select gate, and the top surface of the floating gates is higher than that of the select gate forming a hollow structure on the select gate between the two floating gates. The control gate disposed on the substrate covers the select gate and the two floating gates and fills the hollow structure. The doped region is disposed in the substrate on one side of the two floating gates opposite to the select gate.

9 Claims, 6 Drawing Sheets

NON-VOLATILE MEMORY

CROSS-REFERENCE TO RELATED APPLICATION

This application claims the priority benefit of Taiwan application serial no. 94144013, filed on Dec. 13, 2005. All disclosure of the Taiwan application is incorporated herein by reference.

BACKGROUND OF THE INVENTION

1. Field of the Invention

The present invention relates to a semiconductor device. More particularly, the present invention relates to a non-volatile memory, and a manufacturing method and an operating method thereof.

2. Description of Related Art

Since EEPROM among non-volatile memories can be used to store, read, or erase the data several times, and data stored in EEPROM will not be lost even if the power is cut off, EEPROM has become a popular memory device and is widely used in personal computers and electronic apparatuses.

The typical EEPROM employs a doped poly-silicon material for fabricating the floating gate and control gate. Moreover, in order to prevent the problem of data error due to over-erase phenomenon when the typical EEPROM erases, a select gate made of doped poly-silicon is further disposed on the sidewalls of the control gate and the floating gate and above the substrate, i.e. a select transistor is disposed on the side of the memory unit.

However, such memory usually needs an isolation structure to prevent the memory cells from communicating with each other. And a single memory cell of such memory can only store one bit of data, thus it is quite detrimental to the device integrity.

Furthermore, as three kinds of gates (floating gate, control gate and select gate) are disposed, extra lithography steps are required making the fabrication process more complicated, and increasing the fabrication cost, and also increasing the fabrication time. Additionally, the process yield is decreased, and the stability and the reliability of the memory are reduced due to the additional process steps.

SUMMARY OF THE INVENTION

In view of the above, the object of the present invention is to provide a non-volatile memory, the manufacturing method and the operating method thereof, wherein the isolation structure is not included, and the floating gate is formed by self-aligned manner. Thus, the number of masking and etching steps is reduced and the fabrication cost and the process complexity can be substantially reduced.

Another object of the present invention is to provide a non-volatile memory, the manufacturing method and the operating method thereof, wherein two bits of data can be stored in single memory cell, thus both the device integrity and the memory efficiency can be improved.

The present invention provides a non-volatile memory including a substrate, a select gate, two floating gates, a control gate and doped regions. The select gate is disposed on the substrate. The two floating gates are disposed on both sides of the select gate, wherein a top surface of the floating gates is higher than that of the select gate so that a hollow structure is formed on the select gate and between the two floating gates. The control gate disposed on the substrate covers the select gate and the two floating gates and fills up the hollow structure. The doped regions are disposed in the substrate on one side of the two floating gates opposite to the select gate.

According to an embodiment of the present invention, the two adjacent non-volatile memories described above share a common doped region.

According to an embodiment of the present invention, a select gate dielectric layer, for example, is sandwiched between the select gate and the substrate and between the select gate and the two floating gates. A tunneling dielectric layer, for example, is included between the two floating gates and the substrate. A control gate dielectric layer, for example, is sandwiched between the control gate and the select gate, two floating gates, and the substrate.

According to an embodiment of the present invention, the material of the control gate dielectric layer described above includes, for example, silicon oxide/silicon nitride/silicon oxide.

According to an embodiment of the present invention, the material of the select gate, the two floating gate and the control gate include, for example, doped poly-silicon.

The present invention provides a method of fabricating a non-volatile memory. First, a mask layer is formed over a substrate, and then a trench is formed in the mask layer to expose the substrate. Next, a gate structure is formed in the trench, and the gate structure includes, from top to bottom, a dielectric layer, a select gate and a cap layer. Next, the mask layer is removed, and a tunneling dielectric layer is formed over the substrate. Next, floating gates are formed on the sidewalls of the gate structure, and doped regions are formed in the substrate on both sides of the gate structure. A inter-gate dielectric layer is formed on the substrate and a control gate is formed on the substrate.

According to an embodiment of the present invention, the step of forming the floating gates includes, for example, forming a conductive layer over the substrate and performing an anisotropic etching process to etch the conductive layer to form the floating gate.

According to an embodiment of the present invention, the step of forming the select gate includes, for example, forming a conductive material layer on the gate dielectric layer first and then etching the conductive material layer to remove a portion of the conductive material layer until a top surface of the conductive material layer is lower than that of the mask layer.

According to an embodiment of the present invention, the cap layer may be removed after forming the doped region but before forming the inter-gate dielectric layer.

According to an embodiment of the present invention, the gate dielectric layer may be formed using a chemical vapor deposition process.

According to an embodiment of the present invention, the step of forming the cap layer includes, for example, forming a dielectric material layer on the select gate first and removing portions of the dielectric material layer disposed on the mask layer.

According to an embodiment of the present invention, the step of removing portions of the dielectric material layer on the mask layer includes, for example, performing an etching back or chemical mechanical polishing process.

According to an embodiment of the present invention, a pad layer can be formed before forming the mask layer.

According to an embodiment of the present invention, the material of the inter-gate dielectric layer includes silicon oxide/silicon nitride/silicon oxide. The material of the mask layer includes, for example, silicon nitride.

According to an embodiment of the present invention, the material of the select gate, floating gates and the control gate include, for example, doped poly-silicon.

The present invention provides an operating method suitable for operating a memory cell array including a plurality of memory cells. Each of the memory cells includes a select gate formed on the substrate; two floating gates formed on both sides of the select gate, wherein a top surface of the two floating gates is higher than that of the select gate so that a hollow structure is formed on the select gate and between the two floating gates; a control gate formed on the substrate covering the select gate and the two floating gates and filling the hollow structure; doped regions formed in the substrate on one side of the two floating gates opposite to the select gate, wherein the two adjacent memory cells share one doped region; a plurality of bit lines arranged in parallel in the row direction and connecting the doped regions of the memory cells in the same row respectively; a plurality of word lines arranged in parallel in the column direction and connecting the control gates of the memory cells in the same column respectively; multiple select gate lines arranged in parallel in the row direction and connecting the control gates of the memory cells in the same row respectively. The operating method is described, for example, as follows.

During a programming operation, a first voltage is applied to the first bit line coupled to the selected memory cell. A second voltage is applied to the second bit line coupled to the selected memory cell. A third voltage is applied to the word line coupled to the selected memory cell. And a fourth voltage is applied to the select gate line coupled to the selected memory cell, so as to store one data in the floating gate of the selected memory cell close to the side of the first bit line using a source-side injection effect. Wherein the third voltage is higher than the first voltage, and the first voltage is higher than the second voltage.

According to an embodiment of the present invention, during an erasing operation, a fifth voltage is applied to the first bit line coupled to the selected memory cell and a sixth voltage is applied to the word line coupled to the selected memory cell, so that the floating gate of the selected memory cell close to the side of the first bit line can be erased using F-N tunneling effect. Wherein the difference between the fifth voltage and the sixth voltage is larger than 10 V.

According to an embodiment of the present invention, during a reading operation, a seventh voltage is applied to the first bit line coupled to the selected memory cell, an eighth voltage is applied to the second bit line coupled to the selected memory cell, a ninth voltage is applied to the word line coupled to the selected memory cell and a tenth voltage is applied to the select gate line coupled to the selected memory cell, so as to read the bit stored in the floating gate close to the side of the first bit line. Wherein the eighth voltage is higher than the ninth voltage, and the ninth voltage is higher than the seventh voltage.

The operating method of the non-volatile memory in the embodiment of the present invention further includes applying 0 V voltage to the non-selected select gate lines, the non-selected word lines and the non-selected bit lines.

According to an embodiment of the present invention, the first voltage is 6 V; the second voltage is 0 V; the third voltage is 8 V; and the fourth voltage is 4 V. The fifth voltage is 5 V, and the sixth voltage is −12 V. The seventh voltage is 0 V, and the eighth voltage is 5 V. The ninth voltage is 3 V, and the tenth voltage is 4 V.

According to an embodiment of the present invention, because the floating gates are disposed on the sidewalls of the select gate, two bits of data can be stored in single memory cell, and the floating gates can be formed by performing a single anisotropic etching operation and one lithography process can be eliminated. Additionally, as the isolation structure is not required in the non-volatile memory according to the present invention, the number of the masking and etching operations can be reduced. Thus, the fabrication cost is reduced and the fabrication throughput is increased.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

DESCRIPTION OF EMBODIMENTS

Figure 1A:
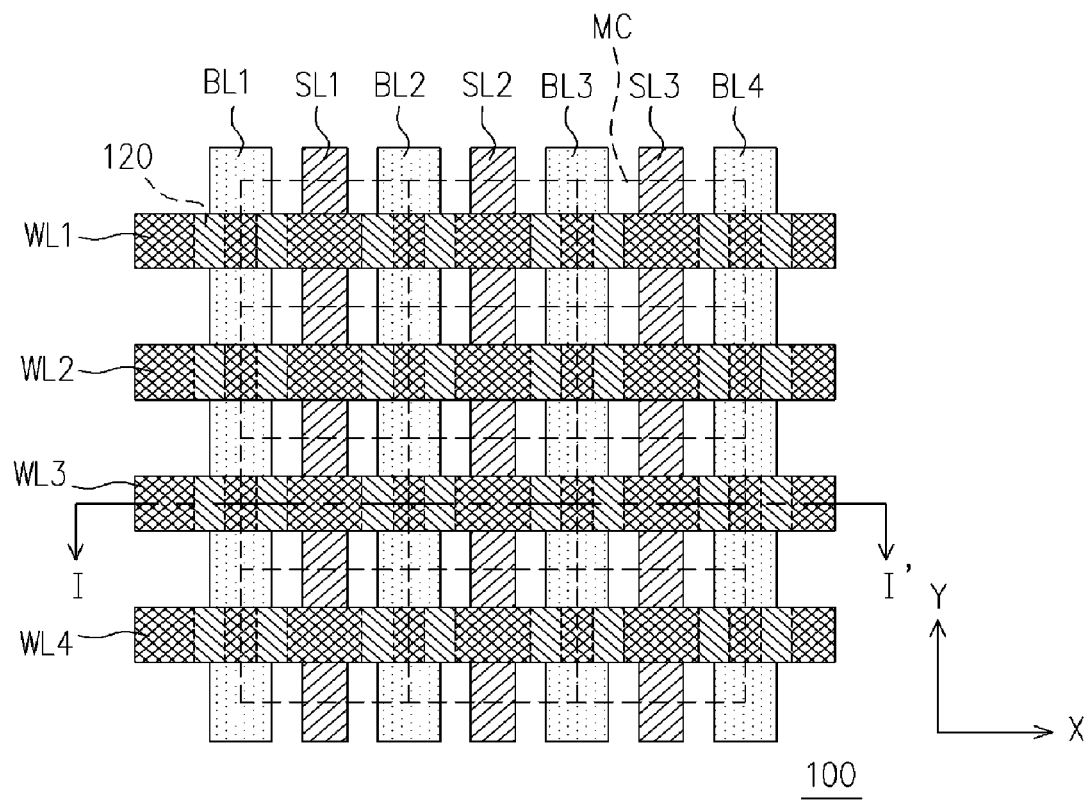
FIG. 1A shows a top view of the non-volatile according to an embodiment of the present invention.
Figure 1B:
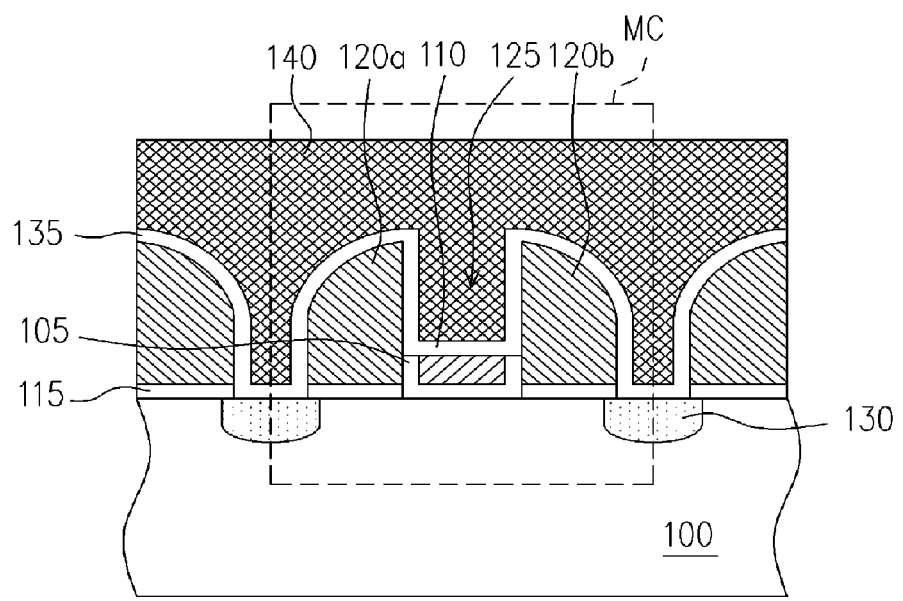
FIG. 1B shows a sectional view of the structure taken along Line I-I' of FIG. 1A.

FIG. 1A shows a top view of the non-volatile according to an embodiment of the present invention. FIG. 1B shows a sectional view of the structure taken along Line I-I' of FIG. 1A.

Referring to FIGS. 1A and 1B, the present invention provides a non-volatile memory, for example, including a plurality of memory cells connected in series. Each memory cell includes, for example, a substrate 100, a select gate 110, two floating gates 120*a*, 120*b*, two doped regions 130*a*, 130*b*, a control gate 140, a select gate dielectric layer 105, a tunneling dielectric layer 115 and a control gate dielectric layer 135.

The substrate 100 is included of, for example, a silicon substrate. The select gate 110 is, for example, disposed on the substrate 100. The floating gates 120*a*, 120*b* are, for example, disposed on both sides of the select gate 110, i.e. a memory cell MC has two floating gates 120. The top of the floating gates 120*a*, 120*b* is, for example, higher than that of the select gate 110 so that a hollow structure 125 is formed on the select gate 110 between the two adjacent floating gates 120*a* and 120*b* in one memory cell. The control gate 140 is, for example, disposed on the substrate 100, covering the select gate 110 and the floating gates 120*a*, 120*b* and filling the hollow structure 125. The doped region 130 is, for example, disposed in the substrate 100 on one side of the left and right floating gates 120*a*, 120*b* opposite to the select gate 110. In one memory cell, two doped regions 130 are also provided.

The select gate dielectric layer 105 is, for example, disposed between the select gate 110 and the substrate 100 and between the select gate 110 and the two floating gates 120a, 120b. The tunneling dielectric layer 115 is, for example, disposed between the two floating gates 120a, 120b and the substrate 100. The material of the select gate dielectric layer 105 and the tunneling dielectric layer 115 include, for example, silicon oxide. Since the charge enters or exits the floating gates 120a and 120b through the doped region 130, the tunneling dielectric layer 115 is thin to improve the performance of the memory.

The control gate dielectric layer 135 is, for example, disposed between the control gate 140 and the select gate 110, floating gates 120a, 120b and the substrate 100, so as to reduce the conduction phenomena between the gates or between the control gate 140 and the substrate 100. The control gate dielectric layer 135 includes, for example, silicon oxide, silicon oxide/silicon nitride, or silicon oxide/silicon nitride/silicon oxide, or other complex dielectric material.

The material of the select gate 110, the floating gates 120a, 120b and the control gate 140 include, for example, conductive materials, such as doped poly-silicon, metal or metal silicides. The doped region 130 includes, for example, doped with N-type or P-type dopants, depending on the design of the device.

The two adjacent memory cells share one common doped region 130. The doped region 130 is serves as the buried bit line of the non-volatile memory. Bit lines BL1, BL2, BL3, BL4 arranged in parallel extend in the Y direction. The select gate lines SL1, SL2, SL3 connect the select gate 110 of the memory cell in the same row. Select gate lines SL1-SL3 arranged in parallel with the bit lines BL1-BL4 extend in the Y direction. The word lines WL1, WL2, WL3, WL4 connect the control gate 140 of each memory cell MC in the X direction in series. Word lines WL1-WL4 arranged in parallel extend in the X direction. The X direction intersects the Y direction.

It should be noted that although the above non-volatile memory described above includes a 3×4 array with 12 memory cells in total in FIG. 1A, the number of the memory cells connected in series by the non-volatile memory of the present invention can be varied according to the actual requirement. For example, 32 to 64 memory cells can be connected in series in the X direction and Y direction to form a memory cell array.

The non-volatile memory according to the present invention can enhance the integration of the device. Furthermore, two floating gates 120a, 120b are disposed on both sidewalls of the select gate 110, and therefore two bits of data can be stored in a single memory cell, thus increasing the efficacy of the memory.

Additionally, as the top of the select gate 110 is lower than that of the floating gates 120a, 120b, the control gate 140 can extend to the region above the select gate 110, thus increasing the capacitance area between the floating gates 120a, 120b and the control gate 140, and improving the coupling capability of the control gate 140.

FIGS. 2A to 2E show the manufacturing flow along Line I-I' of FIG. 1A.

Figure 2A:
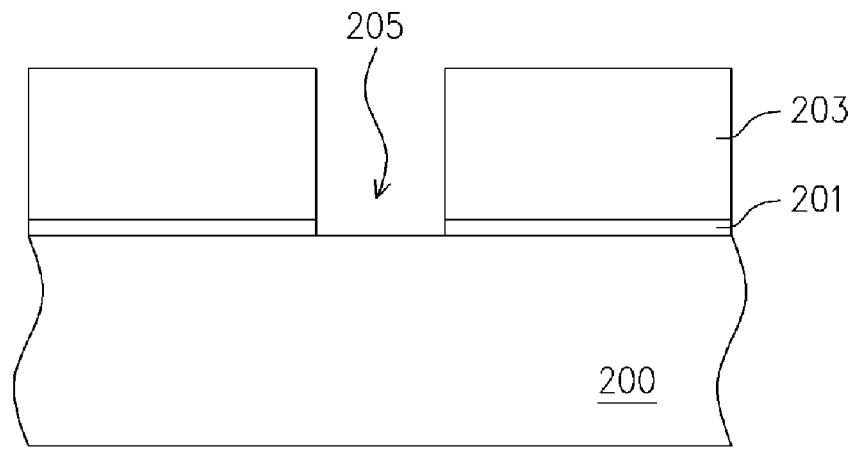
FIGS. 2A to 2E show the manufacturing flow along Line I-I' of FIG. 1A.

Referring to FIG. 2A, first a pad layer 201 is formed over the substrate 200. The material of the pad layer 201 includes, for example, silicon oxide. The pad layer may be formed using, for example, a thermal oxidation or chemical vapor deposition process. Next, a mask layer 203 is formed on the pad layer 201, wherein the material of the mask layer 203 includes, for example, silicon nitride. The mask layer may be formed by using, for example, chemical vapor deposition process. Next, a trench 205 is formed in the mask layer 203 to expose the substrate 200. The trench 205 is formed by, for example, removing a portion of the mask layer 203 and a portion of the pad layer 201 in an anisotropic etching operation.

Figure 2B:
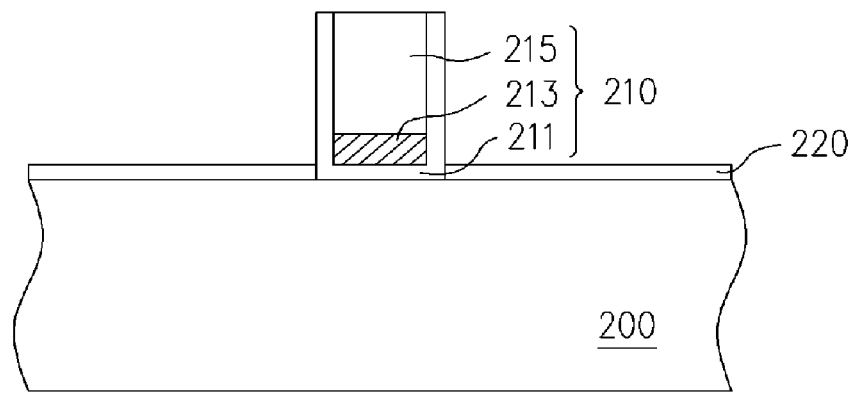

Next, referring to FIG. 2B, a gate structure 210 is formed in the trench 205. The gate structure 210 includes a gate dielectric layer 211, a select gate 213, and a cap layer 215 from bottom to top. The material of the gate dielectric layer 211 includes, for example, silicon oxide. The gate dielectric layer 211 may be formed by using, for example, a low pressure chemical vapor deposition process. The material of the select gate 213 includes, for example, a conductive material, such as doped poly-silicon, metal or metal silicides. The select gate 213 may be formed by, for example, depositing a conductive material layer (not shown), and then etching back the conductive material layer to removing a portion of the conductive material layer until a top surface of the conductive material layer is lower than that of the mask layer 203. The material of the cap layer 215 includes, for example, silicon oxide, boron phosphate silicate glass, or the phosphate silicate glass. The cap layer 215 may be formed by, for example, forming a dielectric material layer (not shown) on the select gate 213, and then removing portions of the dielectric material layer disposed on the mask layer 203. The portions of the dielectric material layer disposed on the mask layer 203 may be removed using, for example, an etching back or chemical mechanical polishing process.

Referring to FIG. 2B, the mask layer 203 and the pad layer 201 are removed by using, for example, wet etching employing hot phosphoric acid to remove the mask layer 203, and using hydrofluoric acid to remove the pad layer 201. Subsequently, a tunneling dielectric layer 220 is formed on the substrate 200. The material of the tunneling dielectric layer 220 includes, for example, silicon oxide, and may be formed by using, for example, chemical vapor deposition process. It should be noted that the pad layer 201 is taken as an example for illustration in FIG. 2A, the pad layer 201 can be optionally formed.

Figure 2C:
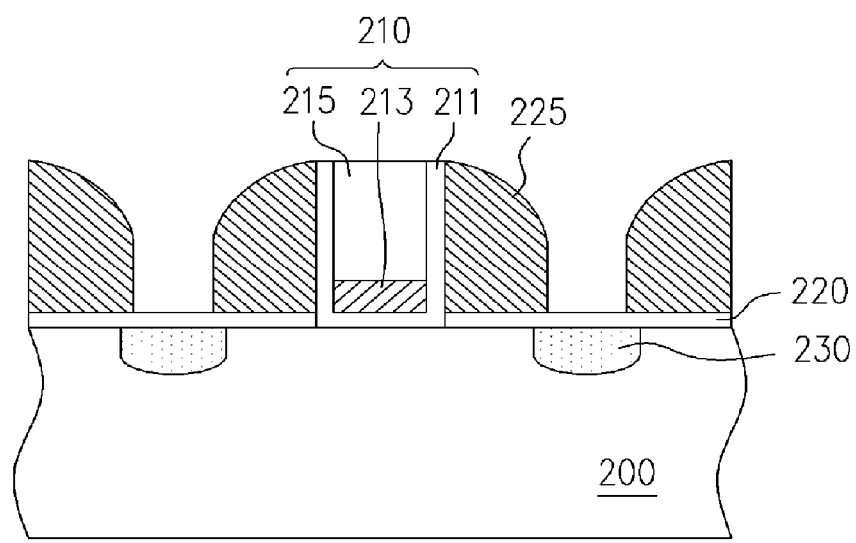

Next, referring to FIG. 2C, a floating gate 225 is formed on the sidewall of the gate structure 210. The floating gate 225 may be formed by, for example, forming a conductive layer (not shown) on the substrate 200, and then performing an anisotropic etching process on the conductive layer such that the floating gates 225 is formed on the gate structure 210 in a self-aligned manner.

The material of the floating gate 225 includes, for example, doped poly-silicon, and may be formed by, for example, performing a chemical vapor deposition process to form an undoped poly-silicon layer, and then performing an ion-implantation process, or performing in-situ doping in a chemical vapor deposition process. The material of the floating gate 225 may also be included of a conductive material other than doped poly-silicon, such as a metal or a metal silicide.

Next, a doped region 230 is formed in the substrate 200 on both sides of the gate structure 210, wherein the doped region may be formed by, for example, using ion-implantation method to implant dopants into the substrate 200 using the gate structure 210 of the floating gate 225 as a mask. The doped region 230 serves as the bit line of the non-volatile memory.

Figure 2D:
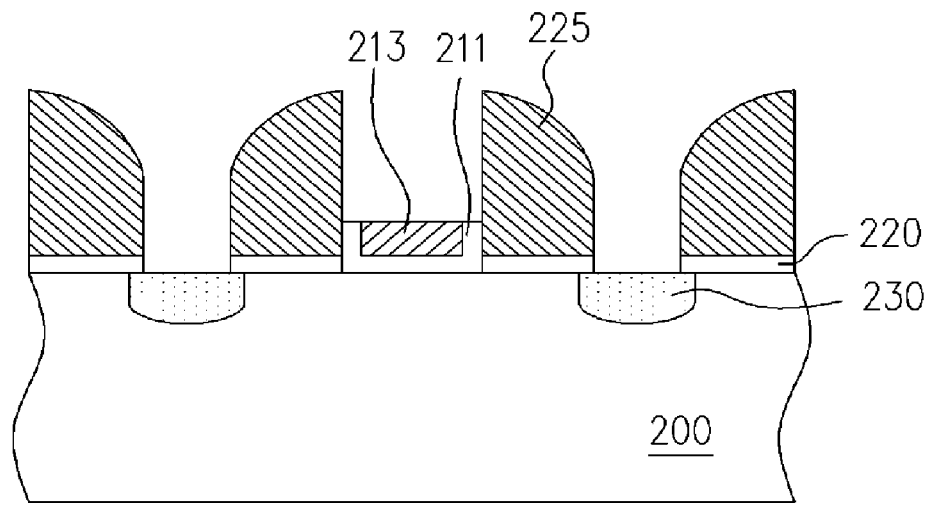

Next, referring to FIGS. 2D and 1A, the strip-shaped floating gate 225 is separated into block-shaped floating gates 225a. The block-shaped floating gates 225a may be formed by, for example, forming a patterned photoresist layer (not shown) on the strip-shaped floating gate 225, and etching a portion of the floating gate 225 using the patterned photoresist layer as a mask to form the block-shaped floating gates 225a, removing the patterned photoresist layer and removing the cap layer 215. The method for removing the cap layer 215 includes, for example, wet etching.

In an embodiment of the present invention, the material of the cap layer 215 is, for example, the same as that of the tunneling dielectric layer 220 and the gate dielectric layer 211 between the cap layer 215 and the floating gate 225a (for example, silicon oxide). During the step of removing the cap layer 215, the exposed gate oxide layer 220 and the gate dielectric layer 211 between the cap layer 215 and the floating gate 225a may also be removed simultaneously. Of course, the cap layer 215 may not be removed completely and a portion of the cap layer 215 may remain on the select gate 213 according to the requirement.

Figure 2E:
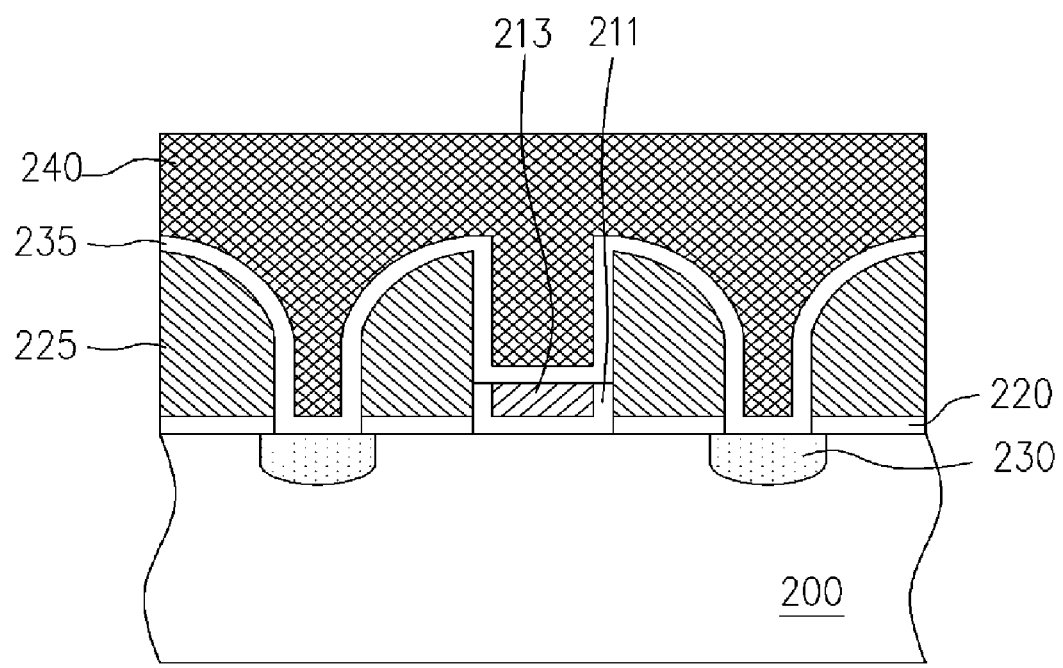

Next, referring to FIG. 2E, a inter-gate dielectric layer 230 is formed on the substrate 200. The material of the dielectric layer includes, for example, silicon oxide/silicon nitride/silicon oxide, and may be formed by, for example, forming a silicon oxide layer by thermal oxidation and forming a silicon nitride layer by chemical vapor deposition, removing a portion of the silicon nitride layer by wet $H_2/O_2$ gas and forming another silicon oxide layer. Of course, the material of the inter-gate dielectric layer 235 can also be included of silicon oxide, silicon oxide/silicon nitride, and so on.

Subsequently, a control gate 240 is formed on the substrate 200. The control gate 240 includes, for example, doped poly-silicon, and may be formed by, for example, forming a doped poly-silicon layer (not shown) and etching the patterned doped poly-silicon layer by the lithography etching process to form the control gate 240 vertically aligned with the doped region 230 and the select gate 213. The doped poly-silicon layer may be formed by, for example, using chemical vapor deposition process to form an undoped poly-silicon layer and then performing the ion-implantation step or performing a in-situ doping in a chemical vapor deposition process. Of course, the material of the control gate 240 may also be included of a conductive material, such as a metal or a metal silicide. The control gate 240 serves as the word line of the non-volatile memory.

In the non-volatile memory provided by the present invention, an isolation structure is not required. The method for forming the floating gate 225 is simple, wherein the gate structure 210 is formed in a self-aligned manner so that the number of the masking and etching processes may be reduced. Thus, the throughput of the fabrication of the memory device is increased and the fabrication cost is reduced.

Figure 3A:
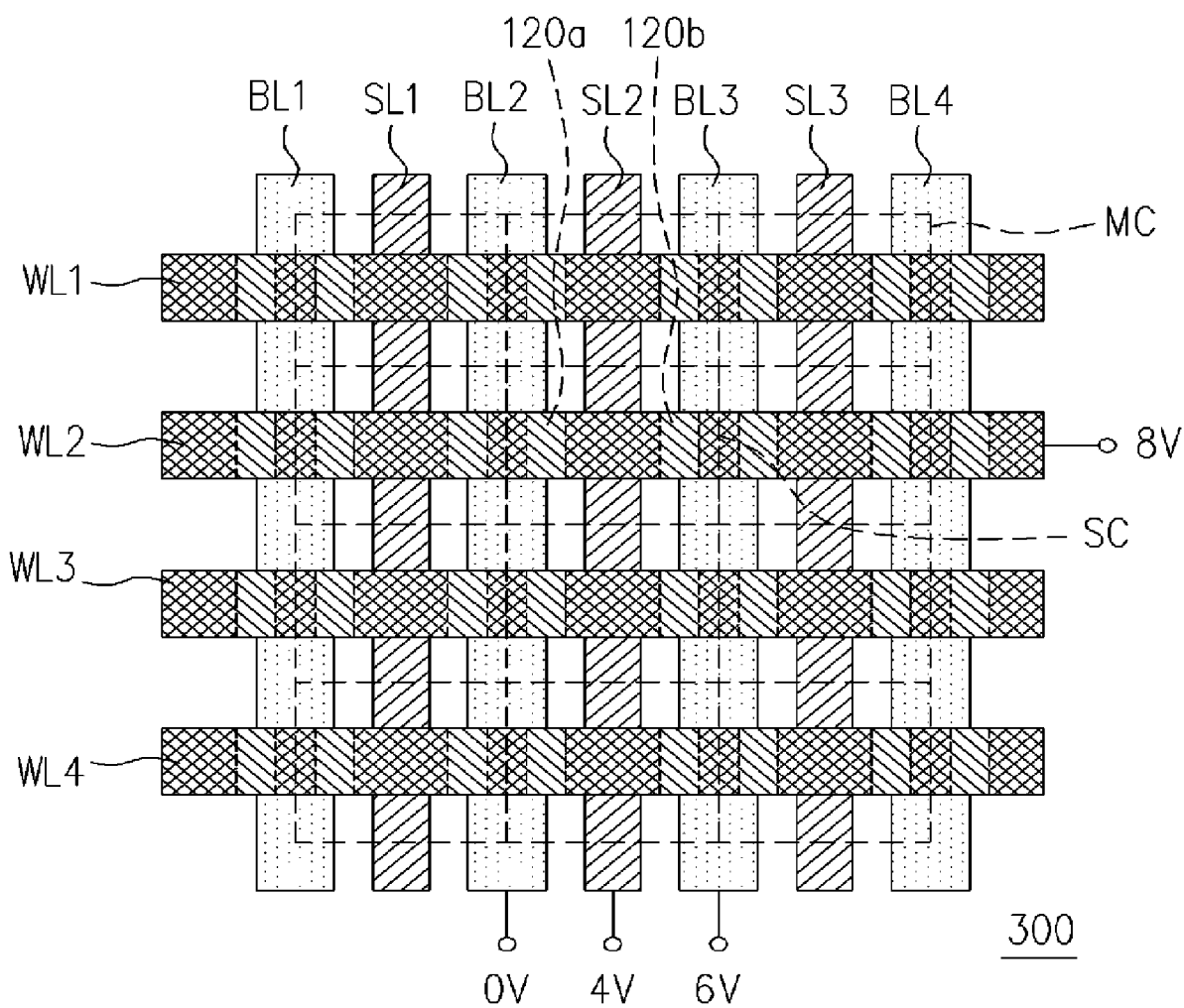
FIG. 3A shows a schematic view of the programmable operation modes of the non-volatile memory according to an embodiment of the present invention.
Figure 3B:
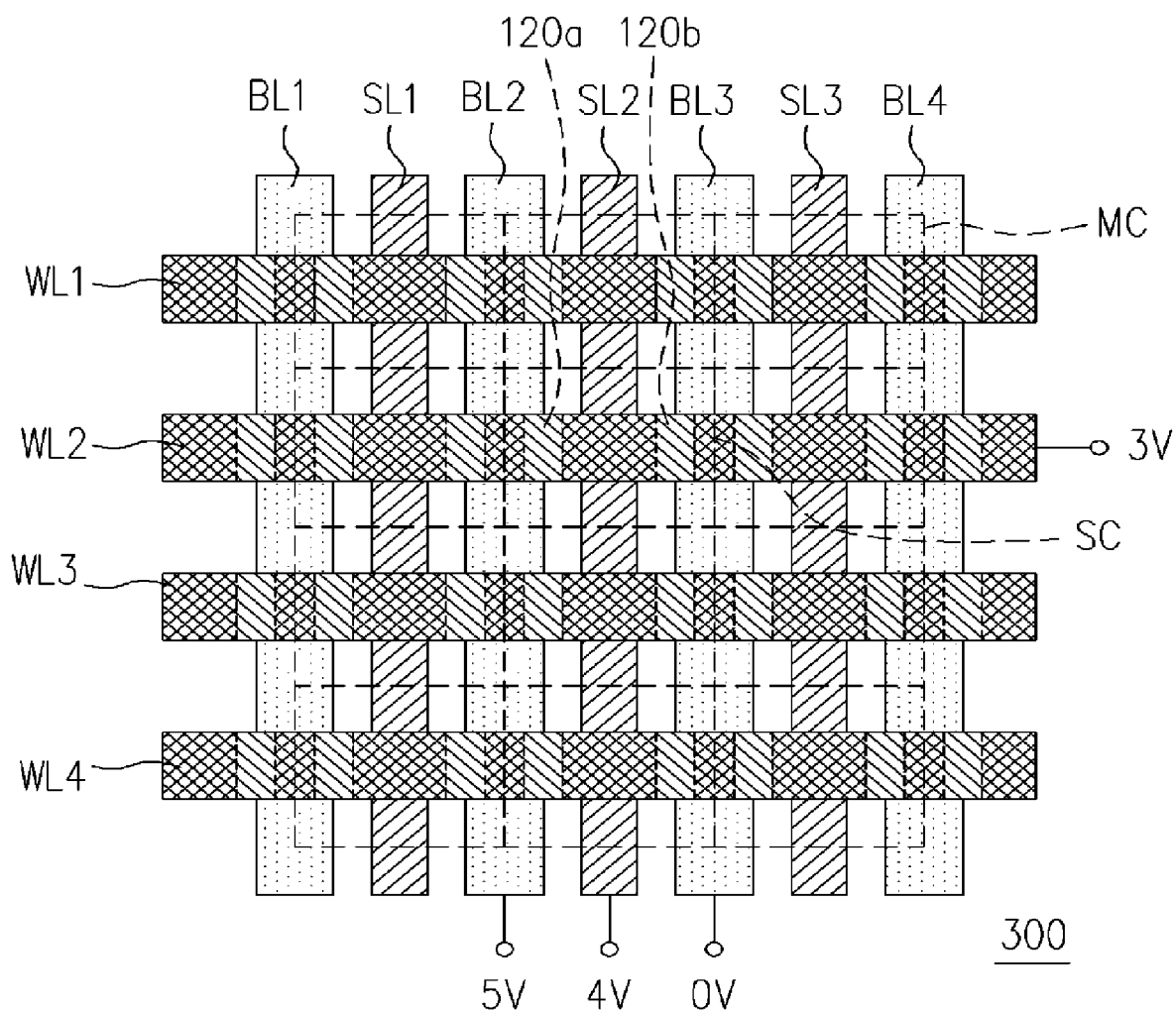
FIG. 3B shows a schematic view of the reading operation modes of the non-volatile memory according to an embodiment of the present invention.
Figure 3C:
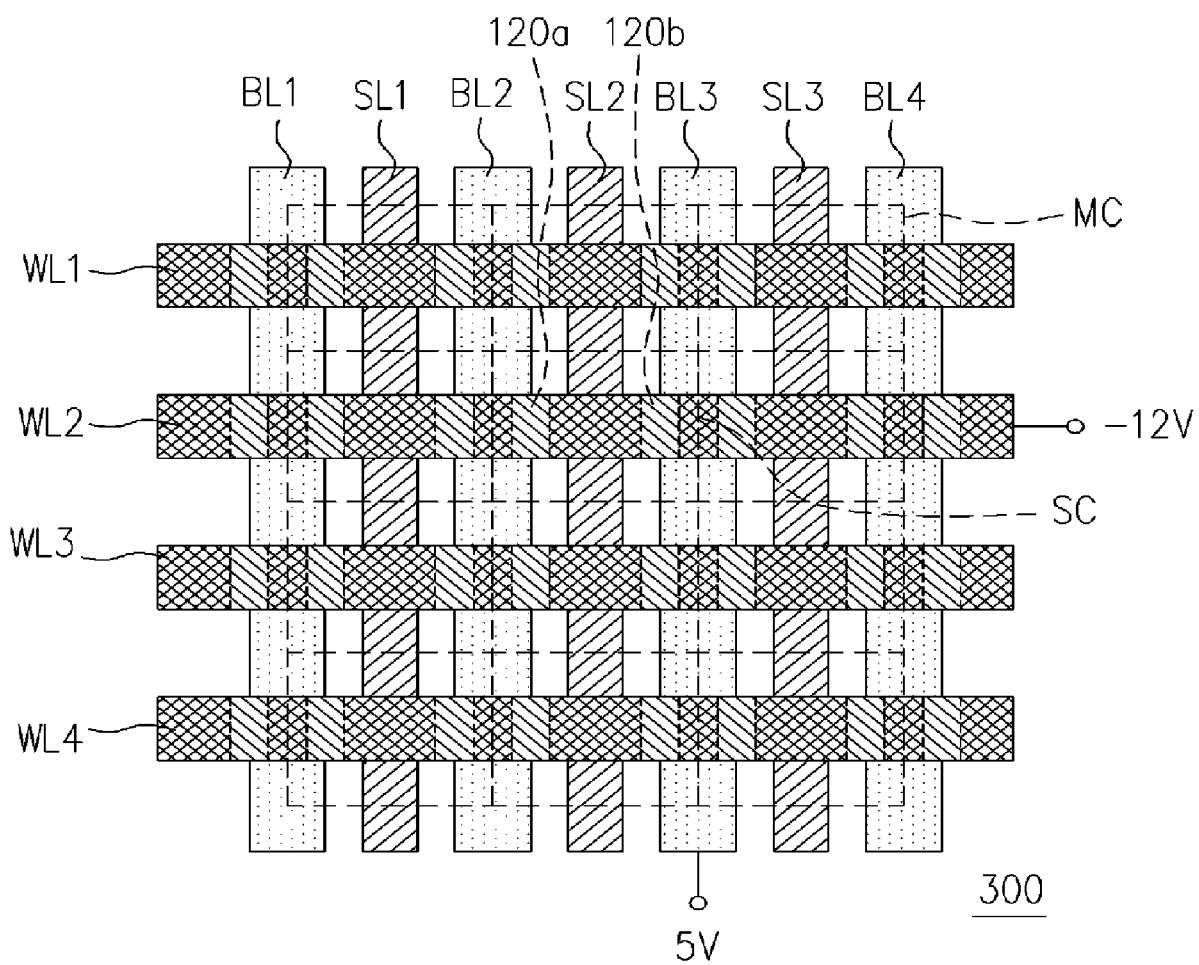
FIG. 3C shows a schematic view of the erasing operation modes of the non-volatile memory according to an embodiment of the present invention.

The operation of the non-volatile memory according to the present invention is described as follows. FIG. 3A shows a schematic view of the programming operation mode of the non-volatile memory according to an embodiment of the present invention. FIG. 3B shows a schematic view of the reading operation of the non-volatile memory according to an embodiment of the present invention. FIG. 3C shows a schematic view of the erasing operation of the non-volatile memory according to an embodiment of the present invention.

Referring to FIG. 3A, the present invention provides an operation method of the non-volatile memory suitable for operating a memory cell array including a plurality of memory cells. Each memory cell includes, for example, a select gate, two floating gates 120a, 120b, a control gate and a substrate 300. The select gate is disposed on the substrate 300, and the floating gates 120a, 120b are disposed on both sidewalls of the select gate. The top surface of the two floating gates 120a, 120b is higher than that of the select gate, thus a hollow structure is formed on the select gate and between the two floating gates 120a and 120b. The control gate covers the select gate and the two floating gates 120a and 120b and fills up the hollow structure. The doped region is disposed in the substrate 300 on both sides of the select gate. (Refer to FIG. 1B and the corresponding description for the structure of the memory cell)

The two adjacent memory cells in the X direction share one doped region, and the doped region is then used as the buried bit line of the non-volatile memory. Bit lines BL1-BL4 are arranged in parallel extend in the Y direction. The select gate lines SL1-SL3 connect the select gate of the memory cell in the same row. Select gate lines SL1-SL3 are arranged in parallel with the bit lines BL1-BL4 extending in the Y direction. The word lines WL1-WL4 connect the control gate 140 of each memory cell in the X direction in series. Word lines WL1-WL4 are arranged in parallel extend in the X direction. The X direction intersects the Y direction.

Referring to FIG. 3A, for programming the selected memory cell SC, the voltage $V_{B3p}$, for example, about 6 V, is applied to the bit line BL3 coupled to the memory cell. The voltage $V_{B2p}$, for example, about 0 V, is applied to the bit line BL2 coupled to the memory cell SC. The voltage $V_{W2p}$, for example, about 8 V, is applied to the word line WL2 coupled with the memory cell SC. The voltage $V_{S2p}$, for example, about 4 V, is applied to the select gate line of the memory cell SC.

The voltage $V_{W2p}$ of the word line WL2 is higher than the voltage $V_{B2p}$ of the bit line BL2, so that the channel below the floating gate 120a is open. The voltage $V_{S2p}$ of the select gate line SL2 is higher than the threshold voltage $V_{th}$ of channel, so that the channel below the select gate SL2 is open. The voltage $V_{W2p}$ of the word line WL2 is higher than the voltage $V_{B3p}$ of the bit line BL3 and the voltage $V_{B3p}$ of the bit line BL3 is higher than the voltage $V_{B2p}$ of the bit line BL2, so that the floating gate 120b is affected by the coupling between the word line WL2 and the bit line BL3. The charge is injected into the floating gate 120b by a source-side injection effect, and one bit of data is stored in the floating gate 120b.

In order to prevent the data from being written in other non-selected memory cells, during the programming operation of the memory cell SC, 0 V can be applied to the bit lines BL1 and BL4, select gate lines SL1 and SL3 which are not coupled to the memory cell SC, and the word lines WL1, WL3 and WL4 which are not coupled to the memory cell SC.

Referring to FIG. 3B, for reading bits stored in the floating gate 120b of the selected memory cell SC, the voltage $V_{B3r}$, for example, about 0 V, is applied to the bit line BL3 coupled to the selected memory cell SC. The voltage $V_{B2r}$, for example, about 5 V, is applied to the bit line BL2 coupled to the memory cell SC. The voltage $V_{W2r}$, for example, about 3 V, is applied to the word line WL2 coupled with the memory cell SC. The voltage $V_{S2r}$, for example, about 4 V, is applied to the select gate line of the memory cell SC. To avoid difficulty in determination during the reading operation, 0 V still can be applied to the bit lines BL1 and BL4, the non-selected word lines WL1, WL3, WL4, and the non-selected select gate lines SL1, SL3.

By the coupling between the voltage $V_{W2r}$ of the word line WL2 and the voltage $V_{B2r}$ of the bit line BL2, the channel below the floating gate 120a is open. The voltage $V_{S2r}$ of the select gate line SL2 is higher than the threshold voltage $V_{th}$ of channel, so that the channel below the select gate SL2 is open. The voltage $V_{B2r}$ of the bit line BL2 is higher than the voltage $V_{BL3}$ of the bit line BL3. The voltage $V_{WL2}$ of the word line WL2 is higher than the voltage $V_{BL3}$ of the bit line BL3, so that the bit of data stored in the floating gate 120b can be read through the channel switch/channel current of the memory cell.

Referring to FIG. 3C, for erasing the selected memory cell SC, the voltage $V_{B3e}$, for example, about 5V is applied to the bit line BL3 coupled to the memory cell SC. The voltage $V_{W2e}$, for example, about −12 V is applied to the word line WL2 coupled to the memory cell. Utilizing the voltage difference between the bit line BL and the word line WL2 and by F-N tunneling, the charge can be injected into the bit line BL3 from the floating gate 120b and then is removed.

The voltage $V_{B3e}$ of the bit line BL3 also can be −5 V. The voltage $V_{W2e}$ of the word line WL2 also can be 12 V. Utilizing the voltage difference between them, the charge of the floating gate 120b is injected to the word line WL2 from the floating gate 120b and then is removed.

Although the operation method of the non-volatile memory is described by t programming, reading and erasing operation of the bit in the floating gate 120b of the selected memory cell SC, the memory cell SC also includes the other floating gate 120a, which can be used to access other data (one-cell-two-bit). Those skilled in the art would understand that the operation of programming, reading and erasing another bit of data may be performed based upon the above descriptions.

The programming and erasing efficiency and operation speed can be improved by using the operation method of the present invention in conjunction with the structure of the non-volatile memory and utilizing a source-side injection effect and FN tunneling.

In view of the above, since the floating gates are disposed on the sidewall of the select gate, two bits of data can be stored in a single memory cell, and as the floating gates can be formed by an anisotropic etching process, a step of the lithography process can be eliminated. Furthermore, the non-volatile memory of the present invention does not require an isolation structure, so that the number of the masking and etching processes can be reduced and the fabrication cost can be reduced, and also the fabrication throughput of the memory device can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory cell, comprising:
   a substrate;
   a select gate disposed over the substrate;
   two floating gates disposed on both sides of the select gate, wherein a top surface of the floating gates is higher than that of the select gate so that a hollow structure is formed on the select gate between the two floating gates;
   a control gate disposed over the substrate covering the select gate and the two floating gates and filling the hollow structure; and
   two doped regions respectively disposed in the substrate on one side of the two floating gates.

2. The non-volatile memory cell as claimed in claim 1, wherein two adjacent non-volatile memories share the doped region.

3. The non-volatile memory cell as claimed in claim 1, further comprising a select gate dielectric layer sandwiched between the select gate and the substrate and between the select gate and the two floating gates.

4. The non-volatile memory cell as claimed in claim 1, further comprising a tunneling dielectric layer sandwiched between the two floating gates and the substrate.

5. The non-volatile memory cell claimed in claim 1, further comprising a control gate dielectric layer sandwiched between the control gate and the select gate, the two floating gates and the substrate.

6. The non-volatile memory cell as claimed in claim 5, wherein the material of the control gate dielectric layer comprises silicon oxide/silicon nitride/silicon oxide.

7. The non-volatile memory cell as claimed in claim 1, wherein the material of the select gate comprises doped poly-silicon.

8. The non-volatile memory cell as claimed in claim 1, wherein the material of the two floating gates comprise doped poly-silicon.

9. The non-volatile memory cell as claimed in claim 1, wherein the material of the control gate comprises doped poly-silicon.

* * * * *